(12) United States Patent
Lammel et al.

(10) Patent No.: US 9,354,281 B2
(45) Date of Patent: May 31, 2016

(54) MAGNETIC FIELD SENSOR

(75) Inventors: Gerhard Lammel, Tuebingen (DE);
Stefan Weiss, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 146 days.

(21) Appl. No.: 13/378,090

(22) PCT Filed: Aug. 3, 2010

(86) PCT No.: PCT/EP2010/061277
§ 371 (c)(1),
(2), (4) Date: Mar. 1, 2012

(87) PCT Pub. No.: WO2011/023495
PCT Pub. Date: Mar. 3, 2011

(65) Prior Publication Data
US 2012/0182010 A1     Jul. 19, 2012

(30) Foreign Application Priority Data
Aug. 28, 2009   (DE) .......................... 10 2009 028 956

(51) Int. Cl.
*G01R 33/02*  (2006.01)
*G01R 33/00*  (2006.01)

(52) U.S. Cl.
CPC ................................ *G01R 33/0035* (2013.01)

(58) Field of Classification Search
CPC .... G01R 33/0035; G01R 33/06; G01R 33/07; G01R 33/0017; G01R 33/0023; G01R 15/202; G01R 33/00; G01R 33/02; G01R 33/063; G01R 33/066; G01R 33/072; G01R 33/075; G01R 33/077; G01R 43/00; G01R 43/02; G01R 43/04; G01R 43/065; G01R 43/12; G01R 43/14

USPC ................. 324/244, 247, 249, 252, 253, 258, 324/117 H, 251; 310/317, 319, 328
See application file for complete search history.

(56) References Cited

U.S. PATENT DOCUMENTS 4,500,838 A * 2/1985 Bloomer .................... 324/117 R
5,942,895 A * 8/1999 Popovic et al. ............... 324/251
(Continued)

FOREIGN PATENT DOCUMENTS

DE        19827056          12/1999
DE        102007041230       4/2009
(Continued)

OTHER PUBLICATIONS

International Search Report, PCT International Application No. PCT/EP2010/061277, dated Oct. 14, 2010.

*Primary Examiner* — Tung X Nguyen
*Assistant Examiner* — David Frederiksen
(74) *Attorney, Agent, or Firm* — Norton Rose Fulbright US LLP

(57) ABSTRACT

A magnetic field sensor for measuring a magnetic field at a sensor location has a printed circuit board, including electrically insulating material; a magnetic field sensor element situated on the printed circuit board and connected via electrical contacts to first printed conductors provided on the printed circuit board; and at least one second printed conductor for generating a test magnetic field, the second printed conductor being provided on the printed circuit board and generating a predetermined test magnetic field when a calibration current is applied at the sensor location.

5 Claims, 4 Drawing Sheets

(56) References Cited

U.S. PATENT DOCUMENTS

| | | | | |
|---|---|---|---|---|
| 6,040,690 | A * | 3/2000 | Ladds | G01R 21/08 324/117 H |
| 6,208,884 | B1 * | 3/2001 | Kumar et al. | 600/409 |
| 6,215,318 | B1 | 4/2001 | Schoefthaler et al. | |
| 6,462,531 | B1 * | 10/2002 | Ohtsuka | 324/117 H |
| 6,512,359 | B1 * | 1/2003 | Tamai | G01R 15/207 324/117 H |
| 6,636,029 | B1 * | 10/2003 | Kunze | G01R 33/022 324/117 H |
| 7,394,249 | B2 * | 7/2008 | Kang et al. | 324/253 |
| 8,080,994 | B2 * | 12/2011 | Taylor et al. | 324/252 |
| 2002/0011841 | A1 * | 1/2002 | Goto et al. | 324/251 |
| 2002/0144418 | A1 | 10/2002 | Endo et al. | |
| 2003/0006752 | A1 * | 1/2003 | Goto et al. | 324/117 H |
| 2005/0127785 | A1 * | 6/2005 | Zeighami | 310/328 |
| 2006/0033487 | A1 * | 2/2006 | Nagano et al. | 324/117 H |
| 2009/0167301 | A1 * | 7/2009 | Ausserlechner | 324/252 |
| 2009/0230955 | A1 * | 9/2009 | Kejik et al. | 324/253 |
| 2010/0321010 | A1 * | 12/2010 | van Veldhoven et al. | 324/225 |
| 2011/0031960 | A1 | 2/2011 | Hohe et al. | |

FOREIGN PATENT DOCUMENTS

| | | |
|---|---|---|
| JP | 62-22088 | 1/1987 |
| JP | 2002-372416 | 12/2002 |
| JP | 2005-61940 | 3/2005 |
| JP | 2010014701 | 1/2010 |
| TW | 434411 | 5/2001 |

* cited by examiner

MAGNETIC FIELD SENSOR

FIELD OF THE INVENTION

The present invention relates to a magnetic field sensor and in particular the calibration of such a sensor.

BACKGROUND INFORMATION

Various micromechanical magnetic field sensors which convert an interaction between an electrical current and the magnetic field into a force are available. German Patent No. DE 198 27 056, for example, describes a micromagnetic field sensor, in which a movement of a sensor structure induced by the Lorentz force is detected capacitively via comb-type electrodes. The Lorentz force is utilized in that a lateral movement of the free-floating structure is induced by a current, which is impressed upon an electrical conductor (free-floating) and an externally applied magnetic field.

Furthermore, there are conventional micromagnetic field sensors, which utilize the Hall effect occurring in conductors through which a current flows in the presence of an external magnetic field. Electrons in the conductors are deflected by the external magnetic field, causing a potential difference between the two ends of the conductor, constituting the Hall measurement effect. Additional measurement principles suitable for the microstructure technology include fluxgate sensors, AMR sensors and GMR sensors.

However, a sensor offset may occur in such sensors produced by the microstructure technique; this offset may occur due to tolerances or varying ambient conditions, such as temperature, atmospheric pressure or the like, necessitating an adjustment or calibration of the sensor. As part of such a calibration, a predetermined magnetic field, for example, is applied at the sensor location, and the sensor offset is calculated from the different sensor output values when the magnetic field is applied and when it is absent. German Patent No. DE 198 27 056 describes for this purpose a field coil, which is designed as a calibration current loop and is situated on the substrate surrounding the sensor. The field coil is thus integrated into the microsensor element itself. Such a configuration is also known as "coil on chip." Since the geometric configuration of the field coil and the conductor cross section and the specific resistivity are known, the magnetic field occurring at the sensor location at a predetermined test current may be ascertained either experimentally or by calculation. The advantage in comparison with external coil configurations, which are part of a test instrument, for example, is that complex test equipment is not necessary to ensure homogeneity and stability of the field at the sensor location over time.

SUMMARY

An example magnetic field sensor according to the present invention for measuring a magnetic field at a sensor location may include a printed circuit board of electrically insulating materials; a magnetic field sensor element, which is formed as a microsystem in particular, situated on the printed circuit board and connected via electrical contacts to first printed conductors provided on the printed circuit board; and at least one second printed conductor for generating a test magnetic field, which is provided in or on the printed circuit board and generates a predetermined test magnetic field when a calibration current is applied at the sensor location through the second printed conductor.

In the case of such a magnetic field sensor, printed conductors for generating the test magnetic field are provided for adjusting the magnetic field sensor on the printed circuit board. This makes it possible to eliminate field coils in the test instrument. Furthermore, in comparison with configurations in which field coils are integrated into a micromagnetic field sensor element, this has the advantage that no chip area need be provided for the integrated field coil. The integration complexity and consequently also the cost may thus be kept low. The thermal load in applying the calibration current is also lower with the configuration according to the present invention. Furthermore, higher currents and thus also stronger magnetic fields are possible than with coil-on-chip configurations.

The second printed conductor may surround the magnetic field sensor element in the form of a loop, for example. Thus, when the calibration current is applied at the sensor location, a test magnetic field, which is generally perpendicular to the sensor surface of the magnetic field sensor element, is generated.

Furthermore, it is also possible to place a second printed conductor on the (same side of the) printed circuit board on two opposite sides of the magnetic field sensor element, so that these two second printed conductors are situated parallel to one another. This has the advantage that, with appropriate triggering, a test magnetic field may be induced perpendicularly to the sensor surface and a test magnetic field may be induced tangentially to the sensor surface.

It is advantageous if the extension of the two parallel printed conductors in the direction along one edge of the magnetic field sensor element on whose side they are situated is at least five times greater, preferably at least ten times greater, than their extension in the direction of a side edge of the magnetic field sensor element perpendicular thereto. This creates a relatively large test magnetic field at the sensor location.

It is also possible that two pairs of two parallel printed conductors each may be provided for generating a test magnetic field, so that the two pairs of printed conductor are situated at a right angle to one another, as seen from above, but are electrically insulated from one another. With appropriate triggering, test magnetic fields may be generated in all three directions in space using such a configuration. The two pairs of printed conductors may be situated on different metal planes of the printed circuit board to electrically insulate them from one another.

Furthermore, a combination of a magnetic field sensor as described above with a test instrument is made available, so that the test instrument may be operatively connected to the magnetic field sensor and is equipped to apply a predetermined calibration current to the at least one second printed conductor. One advantage of this configuration is that the test instrument need not be equipped with a field coil for generating the test magnetic field and thus may be simplified.

DETAILED DESCRIPTION OF EXAMPLE EMBODIMENTS

Figure 1:
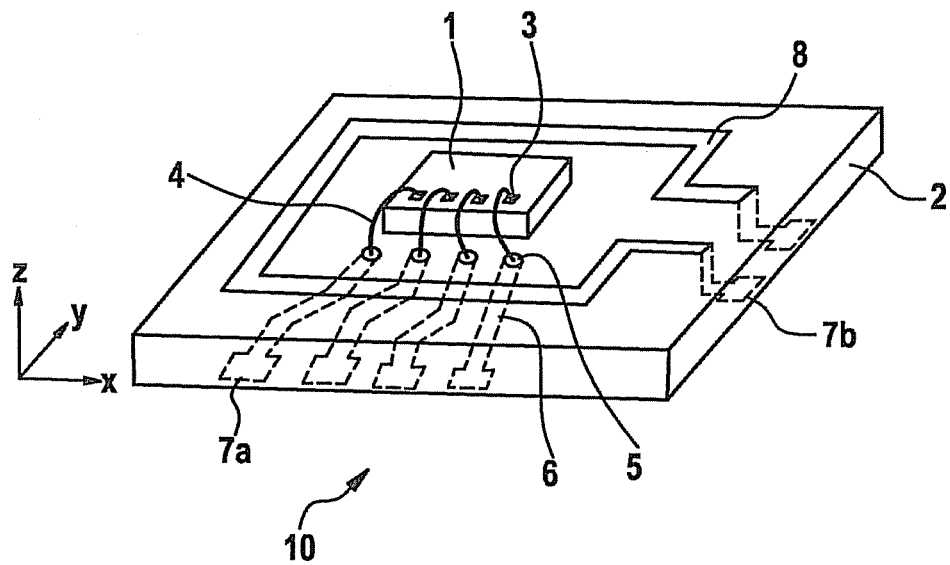
FIG. 1 shows a perspective view of a magnetic field sensor according to a first exemplary embodiment of the present invention.

FIG. 1 shows a perspective view of a magnetic field sensor 10 according to a first exemplary embodiment of the present invention. Magnetic field sensor 10 includes a sensor element 1 mounted on, e.g., glued to, a printed circuit board 2.

Sensor element 1 is designed as a microsystem, i.e., the sensor structure for generating a sensor signal corresponding to the size of the magnetic field to be measured is provided monolithically on a semiconductor chip made of silicon, for example. Sensor element 1 in this exemplary embodiment is designed as a Hall sensor and generates an analog signal corresponding to the z component of the magnetic field at the sensor location. This analog signal is low-pass filtered and converted to a digital sensor signal by an analog-digital converter. In the present example, this further processing of the analog signal is implemented by a data processing unit integrated into sensor element 1. However, it is also possible to provide a separate module, e.g., an ASIC, for this data processing on printed circuit board 2.

Printed circuit board 2 (also referred to as "PCB") is made of an electrically insulating material, for example, fiber-reinforced plastic. Printed circuit board 2 has at least two metal planes, which are provided on the top side and the bottom side of printed circuit board 2, for example. Printed conductors, e.g., etched from a thin copper layer, are provided in these metal planes. In FIG. 1, printed conductors, which are not actually visible from the outside, on the bottom of printed circuit board 2 and through-contacts are represented by dotted lines.

Four contacts 3, which are connected to bond lands 5 on the top side of printed circuit board 2 (first metal plane) by bond wires 4, are provided on sensor element 1. In the present example, bond lands 5 are connected by through-contacts to first printed conductors 6, which are provided on the bottom of printed circuit board 2 (second metal plane), and bond lands 5 are connected to LGA terminals 7a on the outer edge of printed circuit board 2.

A second printed conductor 8, which surrounds sensor element 1 in the form of a loop, is provided in the first metal plane of printed circuit board 2. This second printed conductor 8 is connected to LGA terminals 7b at the edge of printed circuit board 2 on the second metal plane via through-contacts. This second printed conductor 8 applies a test field within the context of a sensor adjustment, as described in greater detail below.

Magnetic field sensor 10 may be extrusion-coated using an insulating material and accommodated in a plastic housing or the like (not shown in detail). It may then be connected to a control unit or a trigger and evaluation electronic system via LGA terminals 7a and 7b and an LGA (land grid array).

Sensor element 1 is triggered via two LGA terminals 7a. The digital signals generated by sensor element 1 are picked up by two other LGA terminals 7a. However, it has been found that in the case of Hall sensors in particular, a sensor offset occurs, possibly amounting to as much as a few milliteslas. If the sensor offset is too great, sensor 10 may be useless and should be discarded.

Figure 2:
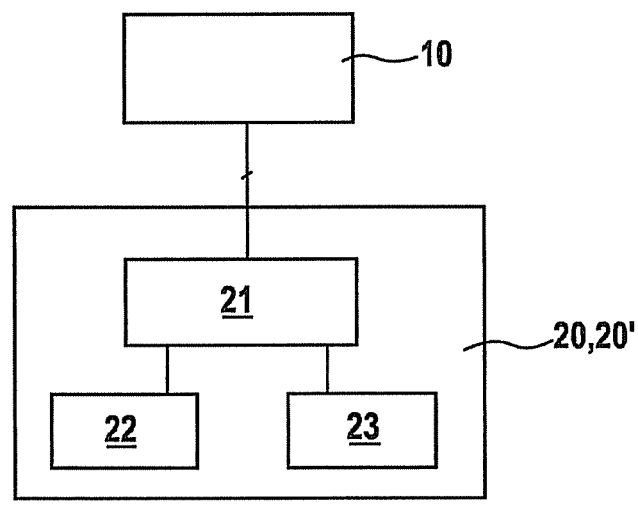
FIG. 2 shows a block diagram of a combination of a magnetic field sensor according to the present invention with a test instrument.

In a first variant of the first exemplary embodiment, the sensor offset and the sensor sensitivity are determined in the so-called final measurement, i.e., following the manufacture of sensor 10, in the generation of a test field using second printed conductors 8. To this end, a test instrument 20 as shown schematically in FIG. 2 is used. This test instrument 20 includes a control unit 21, a memory 22 and a signaling unit 23. Signaling unit 23 may be designed as a visual and/or acoustic display device, for example. Furthermore, the test instrument includes a placement area (not shown in detail) having a number of contacts, corresponding to terminals 7a, 7b on printed circuit board 2 of sensor 10. Test instrument 20 may be operatively connected to sensor 10 by placing sensor 10 in this placement area.

Figure 3:
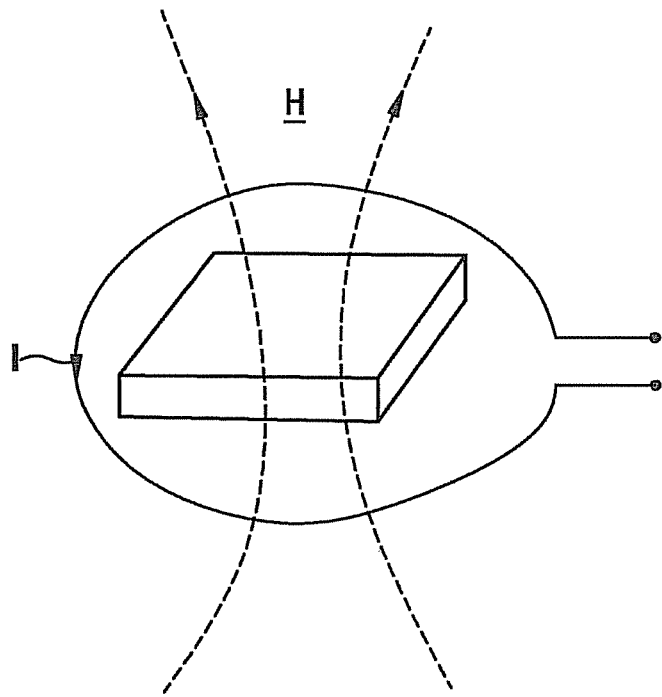
FIG. 3 schematically shows the calibration current and the test magnetic field induced by it at the sensor location according to the first exemplary embodiment.

After sensor 10 is placed on this placement area, control unit 21 causes a predetermined calibration current of 0.01 to 1000 mA, for example, to flow (via a driver circuit or the like) through second printed conductor 8 surrounding sensor element 1 in the form of a loop in a first direction of current flow. This calibration current I causes a certain test magnetic field H in the z direction at the sensor location. This is shown schematically in FIG. 3. Since the geometry of the sensor, i.e., the geometry of the printed conductors and their configuration in relation to the sensor location, is known, as is the size of the calibration current, the size of the test magnetic field is also known. Alternatively, it is also possible to determine this test magnetic field by a calibration measurement using a separate magnetometer. The test magnetic field is then measured using sensor element 1. To this end, sensor element 1 is triggered by control unit 21 via the LGA terminals, and the instantaneous (digital) sensor signal is read out, and a corresponding value is stored in memory 22. Control unit 21 next causes a predetermined calibration current flow of the same size but the opposite sign, reading out the resulting sensor signal and storing the corresponding value in memory 22.

Control unit 21 then determines the offset and the sensor sensitivity from the stored values. For example, if the test magnetic field is +50 µT or −50 µT and the corresponding readout (digital) sensor signal is 20 lsb or −22 lsb (lsb=least significant bit), then an offset of 1 lsb may be determined. The sensor sensitivity corresponds to the difference between the two readout values divided by the difference in the test magnetic field strengths, so that a sensor sensitivity of 42 lsb/100 µT is obtained in this example. If the thus ascertained offset and/or the sensor sensitivity is/are greater than the predetermined tolerance values, control unit 21 outputs a status signal to signaling device 23, indicating visually or acoustically, for example, whether sensor element 10 is within the tolerance values or whether it is outside of the tolerance values and is thus considered to be defective.

If control unit 21 has ascertained that sensor element 10 is not defective, then control unit 21 causes a value corresponding to the sensor sensitivity to be stored in a memory area of sensor element 1. It is also possible to store the sensor offset in sensor element 1, but it must be considered here that the sensor offset depends greatly on ambient conditions at the site of use of the sensor. Metallic components and conductors through which current flows may thus result in interference fields which affect the sensor offset. There is also a substantial temperature dependence with Hall sensors in particular, making a periodic adjustment or a periodic determination of the sensor offset appear appropriate. However, the sensor sensitivity is comparatively independent of ambient conditions at the site of use and may therefore also logically be stored in sensor element 1 for the final measurement, to then be referenced later at the site of use.

In this first variant, it is advantageous that a final measurement may be performed using a test instrument which does not have any coils for generating the test magnetic field. The test instrument may thus have a simplified design.

In a second variant of the first specific embodiment, sensor 10 is installed at its use site (e.g., as a steering angle sensor in a motor vehicle or the like). Here again, sensor 10 is connected via an LGA to a sensor control unit 20', which is able to apply a test current to printed conductor 8 and thus corresponds to a test instrument according to the first variant in a corresponding design (cf. FIG. 2). Sensor control unit 20' determines the sensor offset in the described manner for the first variant. This sensor offset is stored in memory 22 and is used for correction or calibration of the sensor signal output by sensor control unit 20'. In this second variant, it is advantageous that sensor 10 may be tested at any time and recalibrated if necessary.

Figure 4:
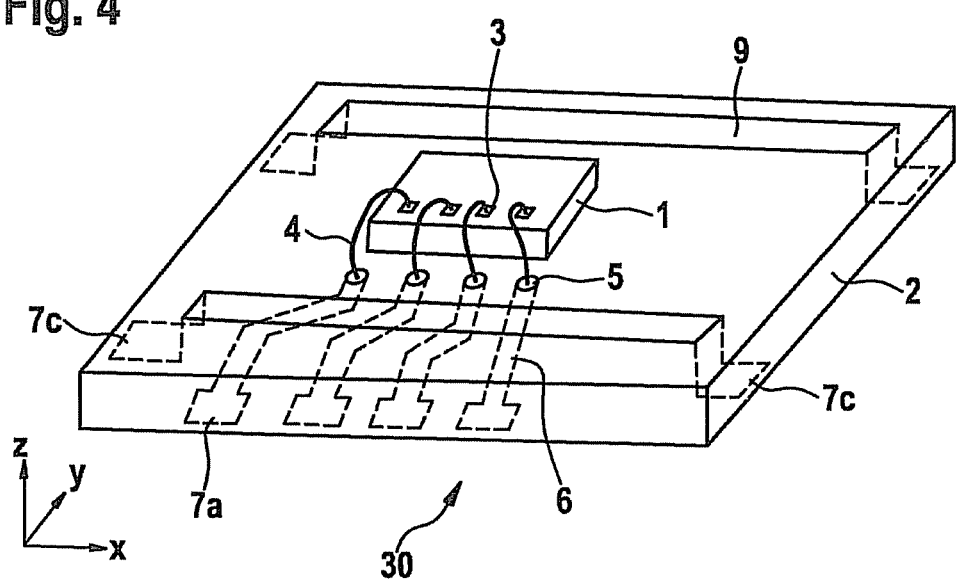
FIG. 4 shows a perspective view of a magnetic field sensor according to a second exemplary embodiment of the present invention.

FIG. 4 shows a perspective view of a magnetic field sensor 30 according to a second exemplary embodiment of the present invention. Features corresponding to magnetic field sensor 10 according to the first exemplary embodiment are labeled with the same reference numerals and are not explained in greater detail here.

Figure 5A:
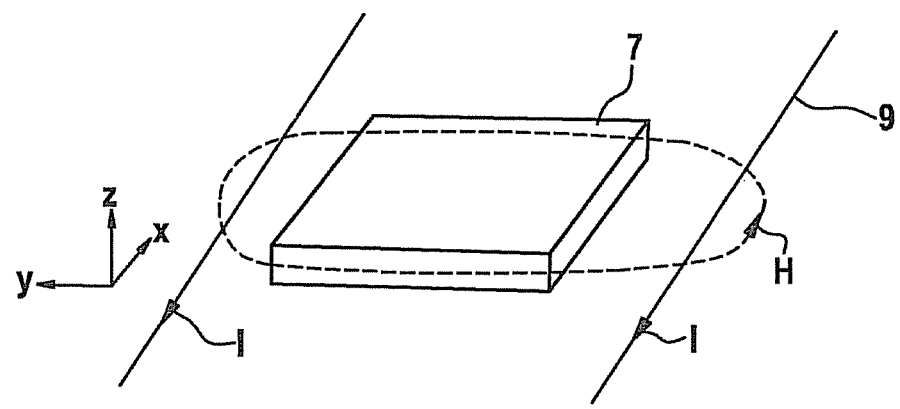
FIG. 5A shows a perspective diagram schematically illustrating the calibration current and the test magnetic field induced by it at the sensor location according to a first variant of the second exemplary embodiment.
Figure 5B:
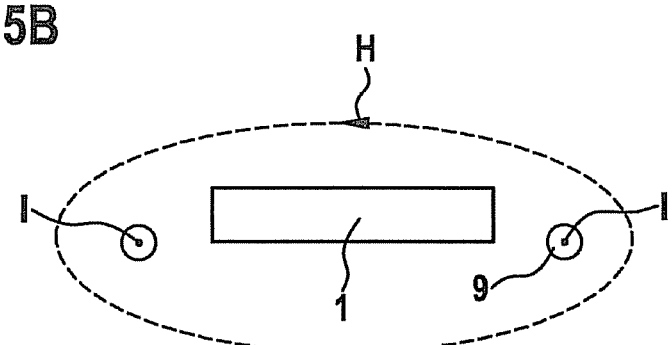
FIG. 5B shows a sectional view schematically illustrating the calibration current as well as the test magnetic field induced by it at the sensor location according to a first variant of the second exemplary embodiment.
Figure 6A:
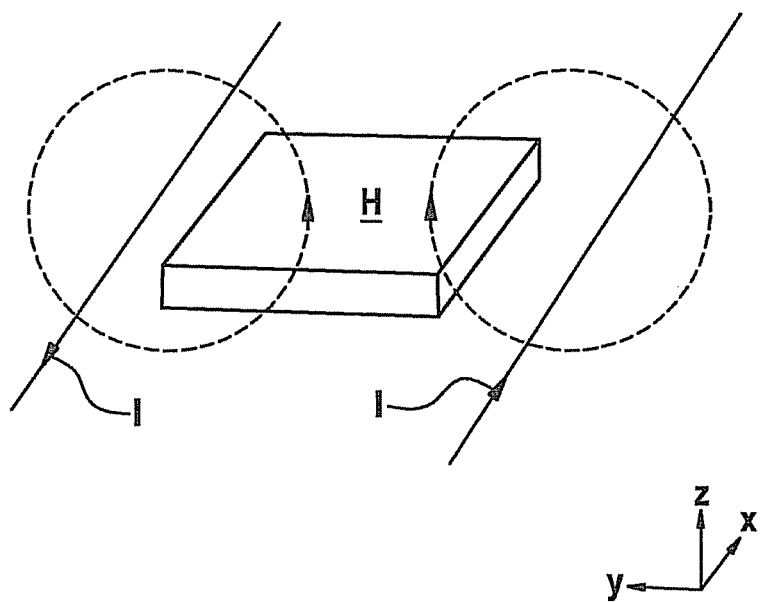
FIG. 6A shows a perspective diagram schematically illustrating the calibration current as well as the test magnetic field induced by it at the sensor location according to a second variant of the second exemplary embodiment.
Figure 6B:
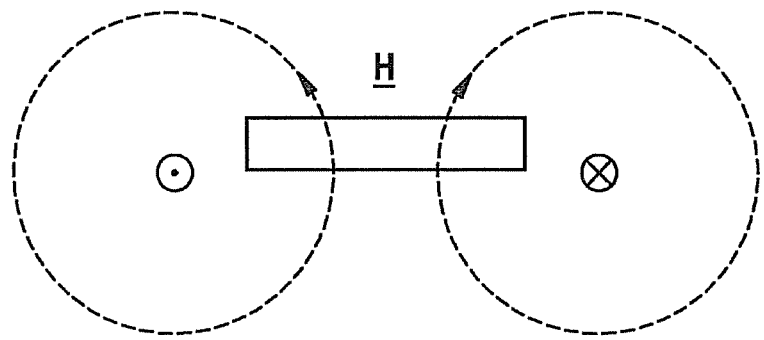
FIG. 6B shows a sectional view schematically illustrating the calibration current as well as the test magnetic field induced by it at the sensor location according to a second variant of the second exemplary embodiment.

Magnetic field sensor 30 according to the second exemplary embodiment differs from magnetic field sensor 10 according to the first exemplary embodiment with respect to the configuration of second printed conductors 9. Magnetic field sensor 30 is provided with two straight parallel printed conductors 9 situated on the first metal plane. Printed conductors 9 are connected to LGA terminals 9c on the second metal plane via through-contacts. Printed conductors 9 are situated along sensor element 1 on two sides of sensor element 1. More precisely, they extend in one direction (x direction) along the front edge and the rear edge of sensor element 1 in FIG. 4, namely each over a distance longer than (e.g., at least twice as long as) the extension of sensor element 1 in the direction of these edges. Furthermore, its extension in the direction along the edge on whose side it is situated (x direction) is much greater (e.g., at least five times greater or preferably at least ten times greater) than its extension in the direction of the other side edges (y direction) situated perpendicularly thereto. Current flow I through printed conductors 9 thus runs essentially in a direction tangential to the sensor location. This causes a current flow I through printed conductors 9 to generate a relatively strong magnetic field at the sensor location. This is diagramed schematically in FIGS. 5A and 5B; FIG. 5A shows a diagram of a perspective view of sensor element 1 and printed conductors 9, and FIG. 5B shows a diagram of a cross-sectional view through the y-z plane of sensor element 1 and printed conductors 9. As shown in these figures, current flow I through printed conductors 9 generates a magnetic field tangentially to the surface of sensor element 1 if the current flows in the same direction (x direction or y direction) through both printed conductors 9.

In contrast with that, first printed conductors 6 on the second metal plane have a certain extension in the x direction, but their extension in the direction along the edge on whose side it is situated (x direction) is much smaller than its extension in the direction of the other side edges (y direction) situated perpendicularly thereto, namely at least five times greater, preferably at least ten times greater, in the y direction than in the x direction. The current flow through first printed conductors 6 thus runs generally in a direction radial to the sensor location. As a result, a current flow through first printed conductors 6 generates only a relatively small interfering magnetic field at the sensor location.

With the current flow illustrated in FIGS. 5A and 5B, a test magnetic field located generally in the plane of the surface of sensor element 10 (x-y plane) may be generated in sensor element 10 of sensor 30. However, due to an antiparallel current flow through printed conductors 9, it is also possible to generate a test magnetic field H in a direction perpendicular to the surface of sensor element 10 (z direction). The printed conductor configuration illustrated in FIG. 4 thus has the advantage that test magnetic fields in two directions perpendicular to one another may be generated using this printed conductor configuration. It is advantageous here if test instrument 20 or sensor control unit 20' is equipped so that it triggers second printed conductors 9 successively, either by choice or by program control, so that a test magnetic field in the x-y plane and a test magnetic field in the z direction are generated one after the other at the sensor location, and the corresponding measured values are stored in memory 22 and processed further in the manner described above. In this way, test magnetic fields may be generated in two directions in space using a simple conductor configuration.

Furthermore, it is also possible to combine the configurations of second printed conductors 9 in FIGS. 1 and 4 with one another, so that a loop-type printed conductor as well as two parallel printed conductors are provided in or on the same printed circuit board. Preferably either the loop-type printed conductor or the parallel printed conductors are situated on a third metal plane between the first and second metal planes.

In addition, it is also possible to provide the two parallel printed conductors shown in FIG. 4 on the upper first metal plane and to provide two additional parallel printed conductors on a third metal plane between the first and second metal planes, these additional printed conductors intersecting the parallel printed conductors of the first metal plane at an angle of approximately 90° (as seen from above). Using such a configuration, test magnetic fields may be generated in the y direction and in the z direction using the parallel printed conductors of the top first metal plane, and test magnetic fields in the x direction (and z direction) may be generated using the parallel printed conductors of the third metal plane. If necessary, a successive triggering is also advantageous here to generate test magnetic fields in all three directions in space one after the other. This is advantageous in particular in the case of magnetic field sensors designed to measure magnetic field components in the three directions in space.

Although the present invention was described above on the basis of preferred exemplary embodiments, it is not limited to them but instead may be modified in any desired manner. In particular, various features of the embodiments described above may be combined.

For example, it is also possible to use, instead of a Hall sensor, a sensor element having a fluxgate sensor or also having a sensor with which movement of a sensor structure caused by the Lorentz force is detected capacitively or via comb-type electrodes.

It is also possible to provide printed conductors 8 and 9 for generating the test magnetic field on the bottom of printed circuit board 2 and to provide printed conductors 6 connected to sensor element 10 on the top of printed circuit board 2.

What is claimed is:

1. A magnetic field sensor for measuring a magnetic field at a sensor location, comprising:
- a printed circuit board made of an electrically insulating material, having a top surface and a bottom surface;
- a magnetic field sensor element situated directly on the top surface of the printed circuit board and directly connected to at least two first printed conductors situated on the bottom surface of the printed circuit board via electrical contacts, the at least two first printed conductors being situated parallel to one another; and
- two second printed conductors to generate a test magnetic field, the two second printed conductors being situated on the top surface of the printed circuit board and configured to generate a predetermined test magnetic field when a calibration current is applied at the sensor location via the second printed conductor, the magnetic field sensor element being situated between the two second printed conductors and the two second printed conductors being situated parallel to one another, wherein an extension of the two parallel printed conductors in the direction along a side edge of the magnetic field sensor element on whose side they are situated is at least five times greater than their extension in the direction of a side edge of the magnetic field sensor element situated perpendicularly thereto,
- wherein each of the at least two first printed conductors is situated perpendicular to each of the two second printed conductors, and each of the at least two first printed conductors is electrically insulated from each of the two second printed conductors.

2. The magnetic field sensor as recited in claim 1, wherein the extension of the two parallel second printed conductors in the direction along a side edge of the magnetic sensor is at least ten times greater.

3. The magnetic field sensor as recited in claim 1, wherein the first and second printed conductors are situated on different metal planes of the printed circuit board.

4. The magnetic field sensor as recited in claim 1, wherein the magnetic field sensor element is a microsystem.

5. A system comprising:
- a magnetic field sensor for measuring a magnetic field at a sensor location, the magnetic field sensor including a printed circuit board having a top surface and a bottom surface, the printed circuit board being made of an electrically insulating material, a magnetic field sensor element situated directly on the top surface of the printed circuit board and directly connected to at least two first printed conductors situated on the bottom surface of the printed circuit board via electrical contacts, the at least two first printed conductors being situated parallel to one another, and two second printed conductors to generate a test magnetic field, the two second printed conductors being situated on the top surface of the printed circuit board and configured to generate a predetermined test magnetic field when a calibration current is applied at the sensor location via the second printed conductor, the magnetic field sensor element being situated between the two second printed conductors, wherein an extension of the two parallel printed conductors in the direction along a side edge of the magnetic field sensor element on whose side they are situated is at least five times greater than their extension in the direction of a side edge of the magnetic field sensor element being situated perpendicularly thereto,
- wherein each of the at least two first printed conductors is situated perpendicular to each of the two second printed conductors, and each of the at least two first printed conductors is electrically insulated from each of the two second printed conductors, and
- a test instrument operatively connectable to the magnetic field sensor, the test instrument configured to apply a pre-determined calibration current to the at least one second printed conductor.

* * * * *